(12) United States Patent
Tomita et al.

(10) Patent No.: US 7,514,371 B2
(45) Date of Patent: Apr. 7, 2009

(54) SEMICONDUCTOR SUBSTRATE SURFACE PROTECTION METHOD

(75) Inventors: Noriko Tomita, Miyagi (JP); Takashi Ohsako, Miyagi (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 11/700,889

(22) Filed: Feb. 1, 2007

(65) Prior Publication Data

US 2007/0134933 A1 Jun. 14, 2007

Related U.S. Application Data

(62) Division of application No. 10/660,490, filed on Sep. 12, 2003, now Pat. No. 7,189,657.

(30) Foreign Application Priority Data

Oct. 11, 2002 (JP) .............................. 2002-298452

(51) Int. Cl.
*H01L 21/31* (2006.01)
*H01L 21/4763* (2006.01)
*H01L 21/469* (2006.01)

(52) U.S. Cl. ................ 438/758; 438/623; 438/622

(58) Field of Classification Search ................ 438/758, 438/622, 623

See application file for complete search history.

(56) References Cited

U.S. PATENT DOCUMENTS

| 4,581,315 | A | | 4/1986 | Garito |
|---|---|---|---|---|
| 5,605,867 | A | | 2/1997 | Sato et al. |
| 5,827,444 | A | | 10/1998 | Shimizu et al. |
| 5,858,106 | A | * | 1/1999 | Ohmi et al. .................... 134/1 |
| 5,932,493 | A | | 8/1999 | Akatsu et al. |
| 6,165,956 | A | | 12/2000 | Zhang et al. |
| 6,432,481 | B1 | | 8/2002 | Shinozaki |
| 6,716,773 | B2 | | 4/2004 | Egami et al. |

FOREIGN PATENT DOCUMENTS

| JP | 7-275813 | 10/1995 |
|---|---|---|
| JP | 2001-521285 | 6/2001 |

OTHER PUBLICATIONS

"Chemical Contamination in the Semiconductor Process Environment and Countermeasures Thereof". Realize Inc., pp. 268-269 (p. 6 of the specification).

"The Current Status of Contamination in the ULSI Fabricating". Realize Inc., pp. 378-383.

* cited by examiner

*Primary Examiner*—Chuong Anh Luu
(74) *Attorney, Agent, or Firm*—Rabin & Berdo, PC

(57) ABSTRACT

A semiconductor substrate surface protection method for maintaining surfaces thereof clean includes providing a tank containing pure water and a chemical protection material which is a high molecular straight-chain organic compound; and immersing the semiconductor substrate in the tank to deposit the high molecular straight-chain organic compound on the semiconductor substrate for maintaining the surfaces thereof clean. This convenient method prevents deposition of contaminating substances directly onto the semiconductor substrate and enables maintaining of this contaminant-free surface at a low cost.

8 Claims, 2 Drawing Sheets

SEMICONDUCTOR SUBSTRATE SURFACE PROTECTION METHOD

This is a Divisional of U.S. application Ser. No.: 10/660,490, filed Sep. 12, 2003, which issued as U.S. Pat. No. 7,189,657 on Mar. 13, 2007, the subject matter of which is incorporated herein by reference.

BACKGROUND OF THE INVENTION

1. Field of the Invention

The present invention relates to a method of surface protection of a semiconductor substrate for maintaining a clean surface of a semiconductor substrate, in particular silicon semiconductor substrate in a condition in which it is not contaminated with organic substances.

1. Description of Related Art

Typically, in a prior art method of cleaning a semiconductor substrate, a highly clean surface condition is produced by removing the natural oxide film and contaminating substances using chemicals such as hydrofluoric acid, ammonia/hydrogen peroxide, sulfuric acid/hydrogen peroxide, or hydrochloric acid/hydrogen peroxide. In recent years, with advances in semiconductor integration, it has become necessary to perform higher semiconductor surface cleanness and maintain such a condition.

Specifically, various types of contaminating substances adhere to the surface of a semiconductor substrate during the manufacturing steps, so, in order to respond higher integration, it has become necessary not only to remove minute particles of small diameter, metals or organic substances adhering in the manufacturing steps, but also to prevent adhesion of organic substances while the substrate is left to stand between washing and the next step.

Typically, organic substances are present in the air in the clean room and adhere readily and in a short time simply on exposure thereto. As a temporary method of preventing this, currently, a mini-environment technique or a method of organic substance removal using a chemical filter is employed.

However, the prior art methods described above are subject to the following problems. In the case of a mini-environment, a pot or the like is employed and the substrate must be held therein in a sealed condition, so the need for this pot and interfaces and so on for opening and closing the pot require enormous investment.

Also, chemical filters must be provided for example at the air inlet of the manufacturing device/clean room, and regularly changed, which also requires enormous investment.

In view of the above, an object of the present invention is to provide a semiconductor substrate surface protection method whereby the adhesion of contaminating substances in the stages after a clean surface has been obtained can be conveniently prevented and such a surface can be maintained without requiring enormous investment.

SUMMARY OF THE INVENTION

In order to achieve the above object, A method of depositing chemical protection material on the surface of a semiconductor substrate, i.e., a semiconductor substrate surface protection method according to the present invention comprise: washing a semiconductor substrate; and depositing a high molecular straight-chain organic compound on the surface of said semiconductor substrate during or after washing of said semiconductor substrate.

With the method of protection according to the present invention, the surface condition of the semiconductor substrate after a clean surface is obtained can be maintained in a convenient fashion without requiring enormous investment.

Also, actions due to organic contaminating substances are prevented and the high molecular straight-chain organic compound can be removed by the processing temperature of subsequent steps, so the clean surface can be maintained without any problems in the processing steps.

BRIEF DESCRIPTION OF THE DRAWINGS

The foregoings and other objects, features and advantageous of the present invention will be better understood from the following description taken in connection with the accompanying drawings, in which.

DESCRIPTION OF THE PREFERRED EMBODIMENTS

Figure 1:
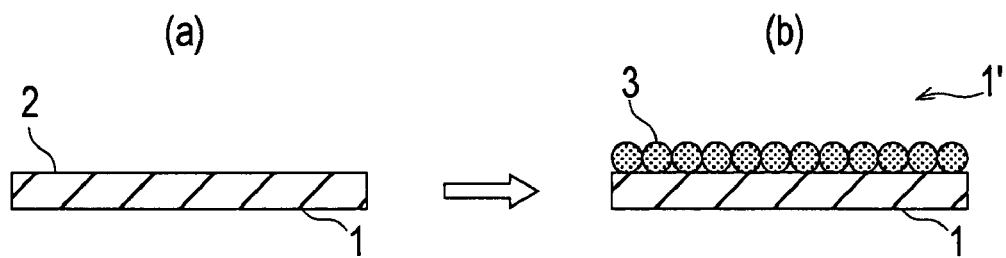
FIG. 1 is an illustration of a semiconductor substrate surface protection method according to a first embodiment of the present invention.

Embodiments of this invention will be described below with reference to the drawings. Note that in the drawings, the form, magnitude, and positional relationships of each constitutional component are merely illustrated schematically in order to facilitate understanding of this invention and no particular limitations are placed on this invention thereby. Further, although specific materials, conditions, numerical value conditions, and so on are used in the following description, these are merely one preferred example thereof and therefore do not place any limitations on this invention. It is to be understood that similar constitutional components in the drawings used in the following description are allocated and illustrated with identical reference symbols, and that duplicate description thereof has occasionally been omitted.

FIG. 1 is an illustration of a semiconductor substrate surface protection method according to a first embodiment of the present invention.

First of all, washing of a semiconductor substrate 1 is performed using a prior art method, as shown in (a) of FIG. 1; a high molecular straight-chain organic compound 3 is deposited on the highly clean surface 2 as shown in (b) of FIG. 1 immediately after the highly clean surface 2 of the semiconductor substrate 1 has been generated, or during washing.

1' shows the condition in which the high molecular straight-chain organic compound 3 has been deposited on the highly clean surface 2 of the semiconductor substrate 1.

A high molecular straight-chain organic compound 3 as referred to herein is a substance which does not easily evaporate from the surface even when the wafer is left to stand at ordinary temperature. For the high molecular straight chain organic substance 3, a substance of lower boiling point than the temperature of the usual heat treatment may be selected. It can therefore be removed before the actual heat treatment in the following heat treatment step.

The heat treatment of the following step is typically for example thermal oxidation or reduced pressure CVD; the heating temperature is about 700° C. to 1100° C. in the case of thermal oxidation and 500° C. to 800° C. in the case of reduced pressure CVD.

The high molecular straight-chain organic compound 3 deposited on the surface is selected from substances of lower boiling point than this heating temperature. The high molecular straight-chain organic compound 3 is preferably a compound that does not contain unsaturated bonds. Also, as the high molecular straight-chain organic compound 3, preferably a single straight-chain organic compound is employed.

The following organic compounds may be listed as examples of the high molecular straight-chain organic compound 3:

(1) cholesterin ($C_{27}H_{46}O$): molecular weight 386.66, boiling point 233° C.; and (2) behenic acid ($C_{21}H_{43}COOH$): molecular weight 340.57, boiling point 306° C.

As such organic compounds 3, high molecular compounds for example as set out at pp. 268 and 269 of the reference "Chemical contamination in the semiconductor process environment and counter-measures therefor" by Realize Inc. may be employed. If such a high molecular compound is employed, substitution with organic substances that are injurious in semiconductor manufacture cannot occur.

Figure 2:
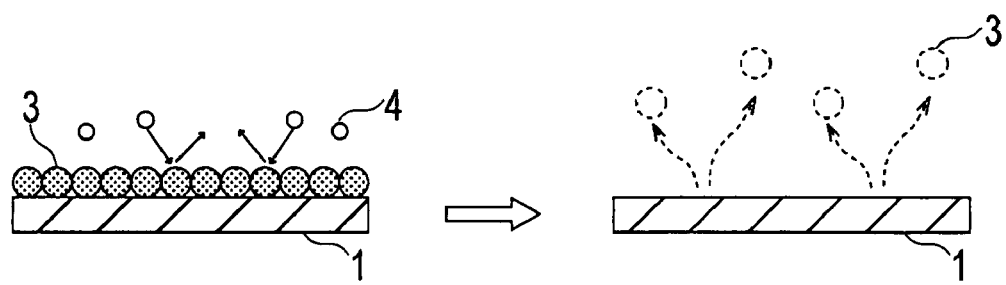
FIG. 2 is an illustration of the effect of the semiconductor surface protection method according to the first embodiment of the present invention.

As described above, with the method of surface protection according to the first embodiment of the present invention, by depositing the high molecular straight-chain organic compound 3 on the highly clean surface 2 of the semiconductor substrate 1 as shown in FIG. 2, the organic compound 3 that has once adhered to the surface does not readily evaporate therefrom, so contamination of the highly clean surface 2 by the action of high molecular straight-chain organic contaminating substances 4 cannot occur.

Also, the high molecular straight-chain organic compound 3 is eliminated from the highly clean surface 2 of the semiconductor substrate during the heat treatment step of the semiconductor manufacturing step, so the heat treatment step can be performed without being affected by organic compound 3 adhering to the semiconductor substrate 1.

Figure 3:
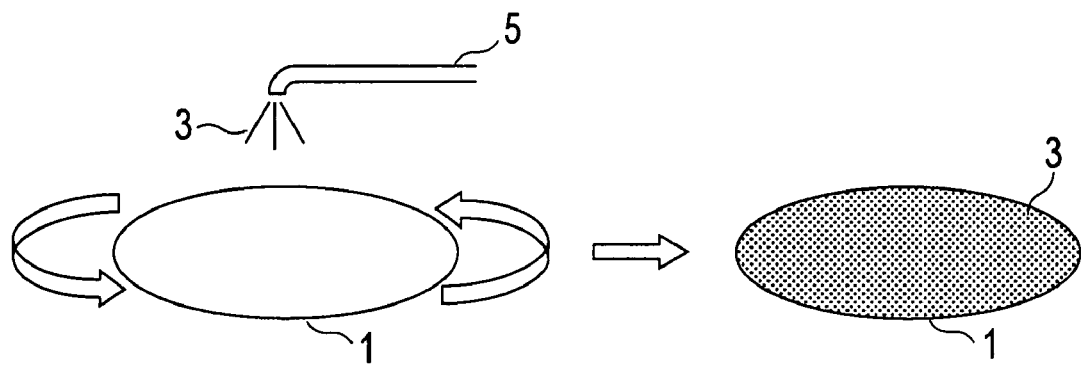
FIG. 3 is an illustration of a semiconductor surface protection method according to a second embodiment of the present invention.

FIG. 3 is an illustration of a method of semiconductor substrate surface protection according to a second embodiment of the present invention.

First of all, washing of a semiconductor substrate 1 is performed using a prior art method; a high molecular straight-chain organic compound 3 is deposited on the highly clean surface 2 immediately after manufacture of the highly clean surface 2, or during washing. As the method of this deposition, a high molecular straight-chain organic compound 3 may be deposited onto a substrate surface 2 by discharging a liquid containing a high molecular straight-chain organic compound 3 as already described in the first embodiment and pure water from a spray nozzle 5 while rotating the semiconductor substrate 1.

As described above, with the second embodiment, the benefit may be expected that the high molecular straight-chain organic compound 3 is uniformly deposited on the semiconductor substrate surface 2.

Figure 4:
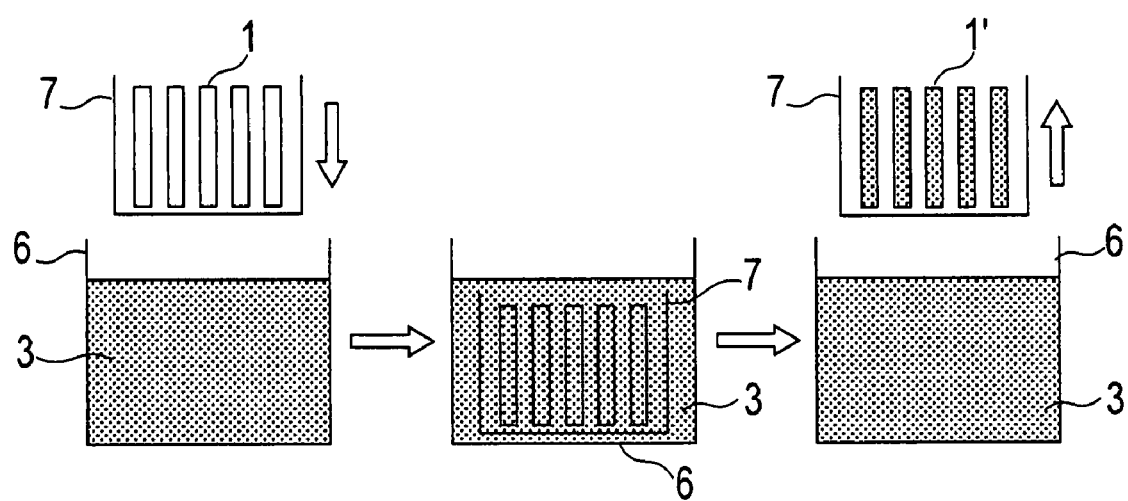
FIG. 4 is an illustration of a semiconductor surface protection method according to a third embodiment of the present invention.

FIG. 4 is an illustration of a semiconductor substrate surface protection method according to a third embodiment of the present invention.

First of all, washing of a semiconductor substrate 1 is performed using a prior art method; a high molecular straight-chain organic compound 3 is deposited on the surface of a semiconductor substrate 1 as described in the first embodiment immediately after manufacture of the highly clean surface, or during washing.

As the method of this deposition, the semiconductor substrate 1, which is arranged in upright fashion in a semiconductor substrate accommodating vessel 7, is inserted into a tank 6 into which high molecular straight-chain organic compound 3 as already described in the first embodiment has been admixed, and is carefully pulled up from the tank 6 when the high molecular straight-chain organic compound 3 has been deposited on the surface of the semiconductor substrate 1. That is, this is a method employing immersion in a bath of a solution containing the high molecular straight-chain organic compound 3 and pure water.

As described above, with the third embodiment, the benefit may be expected that the high molecular straight-chain organic compound 3 is uniformly deposited on the surface of the semiconductor substrate 1. Also, with this method, the high molecular straight-chain organic compound 3 may be deposited on to a plurality of semiconductor substrates 1 at the same time.

Preferably, if the high molecular straight-chain organic compound 3 is a compound containing the COOH group, the benefit of more uniform disposition onto the surface of the semiconductor substrate 1 can be expected.

Further according to the present invention, a cleaned wafer is coated with a high molecular, straight-chain organic oxide having a boiling point lower than the temperature of heat treatment of the wafer processing of the subsequent step.

(1) By employing high molecules, the coating condition can be safely maintained. The reason for this is that, in adsorption of organic substances, organic substances of low molecular weight are the first to be adsorbed, so by substituting these with high molecules, a superior coating condition can be produced. In contrast, if the surface is initially coated with a high molecular organic substance, the probability of substitution by other substances is abruptly reduced, so a superior coating condition cannot be achieved.

(2) When performing wafer treatment such as etching or CVD film formation, the aforesaid high molecular organic substance is required to be easily releasable, without being left behind as a residue on the wafer. Broadly, there are three types of high molecular organic substances, namely, straight-chain organic compounds, cyclic compounds (without double bonds) or cyclic double-bond compounds. Of these, straight-chain organic compounds satisfy the above object and can be sufficiently removed with the temperatures and atmospheres employed in semiconductor manufacture. For this reason, this type was selected.

(3) Also, supplementary to (2) above, by selecting a substance of lower boiling point than the heat treatment temperature of the wafer processing of the next step, this substance can be removed prior to actual heat treatment by the heat treatment of the next step.

It should be noted that the present invention is not restricted to the above embodiments and various modifications are possible based on the gist of the present invention; these are not excluded from the scope of the present invention.

What is claimed is:

1. A semiconductor substrate surface protection method for maintaining surfaces thereof clean comprising:
   providing a tank containing pure water and a chemical protection material which is a high molecular straight-chain organic compound having a boiling point that is lower than 500° C.; and immersing the semiconductor substrate in the tank to deposit the high molecular straight-chain organic compound on the semiconductor substrate for maintaining the surfaces thereof clean.

2. A semiconductor substrate surface protection method for maintaining surfaces thereof clean comprising:

providing a tank containing pure water and a chemical protection material which is a high molecular straight-chain organic compound and is a compound of a single type; and immersing the semiconductor substrate in the tank to deposit the high molecular straight-chain organic compound on the semiconductor substrate for maintaining the surfaces thereof clean.

3. A semiconductor substrate surface protection method for maintaining surfaces thereof clean comprising:

providing a tank containing pure water and a chemical protection material which is a high molecular straight-chain organic compound and is cholesterin ($C_{27}H_{46}O$); and immersing the semiconductor substrate in the tank to deposit the high molecular straight-chain organic compound on the semiconductor substrate for maintaining the surfaces thereof clean.

4. A semiconductor substrate surface protection method for maintaining surfaces thereof clean comprising:

providing a tank containing pure water and a chemical protection material which is a high molecular straight-chain organic compound and is behenic acid ($C_{21}H_{43}COOH$); and immersing the semiconductor substrate in the tank to deposit the high molecular straight-chain organic compound on the semiconductor substrate for maintaining the surfaces thereof clean.

5. The semiconductor substrate surface protection method for maintaining surfaces thereof clean according to claim 1, wherein immersing the semiconductor substrate in the tank uniformly deposits the high molecular straight-chain organic compound on the semiconductor substrate.

6. The semiconductor substrate surface protection method for maintaining surfaces thereof clean according to claim 2, wherein immersing the semiconductor substrate in the tank uniformly deposits the high molecular straight-chain organic compound on the semiconductor substrate.

7. The semiconductor substrate surface protection method for maintaining surfaces thereof clean according to claim 3, wherein immersing the semiconductor substrate in the tank uniformly deposits the high molecular straight-chain organic compound on the semiconductor substrate.

8. The semiconductor substrate surface protection method for maintaining surfaces thereof clean according to claim 4, wherein immersing the semiconductor substrate in the tank uniformly deposits the high molecular straight-chain organic compound on the semiconductor substrate.

* * * * *